US011075832B2

(12) United States Patent
Connolly et al.

(10) Patent No.: US 11,075,832 B2
(45) Date of Patent: Jul. 27, 2021

(54) METHOD AND APPARATUS FOR DATA TRANSMISSION RATE CONTROL IN A NETWORK

(71) Applicant: Rohde & Schwarz GmbH & Co. KG, Munich (DE)

(72) Inventors: David Connolly, Columbia, MD (US); John True, Columbia, MD (US)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/534,438

(22) Filed: Aug. 7, 2019

(65) Prior Publication Data

US 2021/0044511 A1    Feb. 11, 2021

(51) Int. Cl.
*H04L 12/26* (2006.01)
*G01R 31/317* (2006.01)
*H04B 17/00* (2015.01)
*H04B 17/15* (2015.01)

(52) U.S. Cl.
CPC ........ *H04L 43/50* (2013.01); *G01R 31/31723* (2013.01); *G01R 31/31724* (2013.01); *H04L 43/0894* (2013.01); *H04B 17/0082* (2013.01); *H04B 17/15* (2015.01)

(58) Field of Classification Search
CPC ............... H04L 43/50; H04L 43/0894; G01R 31/31724; G01R 31/31723; H04B 17/15; H04B 17/0082
See application file for complete search history.

(56) References Cited

U.S. PATENT DOCUMENTS

| 8,131,223 | B2 * | 3/2012 | Olgaard | H04B 17/29 |
| | | | | 455/67.14 |
| 8,731,493 | B2 * | 5/2014 | Luong | H04L 43/16 |
| | | | | 455/115.2 |
| 8,774,024 | B2 * | 7/2014 | Olgaard | H04L 43/50 |
| | | | | 370/252 |
| 9,055,106 | B2 * | 6/2015 | Tsui | H02J 2207/40 |
| 9,226,167 | B2 * | 12/2015 | Olson | H04W 24/00 |
| 9,810,735 | B2 * | 11/2017 | Kumar | G06F 11/273 |
| 9,813,930 | B1 * | 11/2017 | Ketonen | H04W 24/10 |
| 10,924,379 | B1 * | 2/2021 | Connolly | H04L 43/065 |
| 2005/0222815 | A1 * | 10/2005 | Tolly | H04L 43/50 |
| | | | | 702/185 |
| 2007/0254643 | A1 * | 11/2007 | Garcia | H04L 1/1867 |
| | | | | 455/423 |
| 2010/0268524 | A1 * | 10/2010 | Nath | H04L 67/22 |
| | | | | 703/23 |
| 2010/0268834 | A1 * | 10/2010 | Eidelman | H04L 41/5009 |
| | | | | 709/230 |
| 2011/0149720 | A1 * | 6/2011 | Phuah | H04L 43/50 |
| | | | | 370/216 |
| 2012/0113829 | A1 * | 5/2012 | Olgaard | H04L 1/24 |
| | | | | 370/252 |

(Continued)

*Primary Examiner* — Brian T O Connor
(74) *Attorney, Agent, or Firm* — Potomac Technology Law, LLC

(57) ABSTRACT

A method for data transmission rate control in a network is provided. The method comprises the steps of establishing a connection to a device under test and transmitting rate control commands to the device under test via vendor specific information element fields of transmitting frames in order to control the transmission rate of the device under test.

18 Claims, 5 Drawing Sheets

(56) References Cited

U.S. PATENT DOCUMENTS

| | | | |
|---|---|---|---|
| 2014/0232422 A1* | 8/2014 | Sontakke | G01R 31/31917 324/750.01 |
| 2014/0244204 A1* | 8/2014 | Frediani | G01R 31/31907 702/119 |
| 2015/0092549 A1* | 4/2015 | Anand | H04L 47/22 370/230.1 |
| 2018/0109434 A1* | 4/2018 | Venkiteswaran | H04L 41/145 |
| 2018/0352606 A1 | 12/2018 | Kasagi et al. | |
| 2020/0313999 A1* | 10/2020 | Lee | H04L 43/0847 |

* cited by examiner

| Octets | 1 | 1 | 3 | n-3 |
|---|---|---|---|---|
| Format | Element ID | Length | OUI | Vendor-specific content |

Fig. 3a

| Octets | 1 | 3 | variable |
|---|---|---|---|
| Format | Category | OUI | Vendor-specific content |

Fig. 3b

METHOD AND APPARATUS FOR DATA TRANSMISSION RATE CONTROL IN A NETWORK

TECHNICAL FIELD

The invention relates to controlling data transmission rate in a network, especially in a wireless local area network (WLAN) according to the IEEE 802.11 standards.

BACKGROUND

Nowadays, wireless local area networks (WLANs) based on the IEEE 802.11 standards are widely deployed. The standards cover protocols and operation of WLANs, whereby describing the physical layer and Media Access Control (MAC) layer of the OSI reference model. With the large range of operation bandwidth allocation up to 160 MHz and additional multiple spatial streams, a wireless device connected to an Access Point (AP) may send data packets at any channel bandwidth using any number of spatial streams. Consequently, data transmission can occur at any of the IEEE 802.11 specified allowable data rates. Therefore, in order to analyze the performance of a wireless device, for instance to measure the transmission characteristics of the wireless device, the transmission properties of the transmitting device are needed to be controlled externally.

For example, the document US 2018/0352606 A1 shows a crude data rate control method for measuring characteristics of a wireless device under measurement with an arbitrary modulation scheme or an arbitrary coding rate. The method relates to the suppression of acknowledgement notifications towards the device under measurement for certain Physical Protocol Data Unit (PPDU) types in order to encourage the device under measurement to use a different rate. However, the method is limited to certain PPDU types and is somewhat effective since the target configuration does not occur frequently, for instance less than 10% of the time in some cases.

Accordingly, there is a need to provide a data transmission rate control scheme in order to achieve the target data transmission rate in a simplified manner, especially for measuring the transmission characteristics of a wireless device transmitting along multiple channel bandwidths. Such a data transmission rate control scheme should perform for virtually any case and should not depend on particular PPDU types.

SUMMARY

Embodiments of the present invention advantageously address the foregoing requirements and needs, as well as others, by providing a data transmission rate control scheme in order to achieve the target data transmission rate in a simplified manner, especially for measuring the transmission characteristics of a wireless device transmitting along multiple channel bandwidths, and such that the data transmission rate control scheme performs for virtually any case and should not depend on particular PPDU types.

According to a first aspect of the invention, a method for data transmission rate control in a network is provided. The method comprises the steps of establishing a connection to a device under test and transmitting rate control commands to the device under test via vendor specific information element fields of transmitting frames in order to control the transmission rate of the device under test. Therefore, an extension mechanism built into IEEE 802.11 signaling known as "vendor specific" Information Elements (IE) and corresponding vendor specific action frames are utilized for transporting signaling commands in order to control the transmission behavior of the device under test.

Furthermore, the arrangement of information in a transmission frame is standardized by IEEE 802.11. However, by utilizing the vendor specific IE, additional non-standard information can be embedded on the transmitted fields without breaching the standards. This advantageously facilitates the non-standard, vendor and/or network specific communication of information from an AP to a wireless device, possibly even before the association of the connection.

According to a first preferred implementation form of said first aspect of the invention, the method further comprises the step of exchanging capability information with the device under test during or after the association of the connection. Advantageously, the device under test uses the capability information in order to determine whether it can support the features provided by the network.

According to a second preferred implementation form of said first aspect of the invention, the capability information received from the device under test are rate control capabilities of the device under test. Advantageously, the device under test acknowledges the rate control capability advertisement during or shortly after the association.

According to a further preferred implementation form of said first aspect of the invention, the method further comprises the step of generating the rate control commands based on a corresponding rate control capability of the device under test. Furthermore, multiple control commands with associated parameters can be generated on a single transmission frame in order to address one or more capabilities of the device under test.

According to a further preferred implementation form of said first aspect of the invention, activating a specific rate control capability of the device under test by transmitting a respective rate control command. Advantageously, the transmission rate of the device under test is controlled in a simplified manner.

According to a further preferred implementation form of said first aspect of the invention, the method further comprises the step of updating the rate control commands periodically. Advantageously, the transmission rate of the device under test is varied repeatedly in order to measure the transmission characteristics for a target modulation and coding scheme, bandwidth and/or the number of spatial streams. In addition, the behavior of the device under test under certain conditions, for instance the amount of transmitting data packets, switching between different transmission rates, periodicity, frame size and so on can be thoroughly analyzed.

According to a further preferred implementation form of said first aspect of the invention, the method further comprises the step of incorporating an organization identifier with the transmitting frames, thereby transmitting the organization identifier to the device under test. An organization identifier or an Organizationally Unique Identifier (OUI) acts as a unique signature for a particular vendor or manufacturer. Hence, the device under test can effectively identify a specific vendor or manufacturer with ease.

According to a further preferred implementation form of said first aspect of the invention, the method further comprises the step of receiving capability information from the device under test based on the transmitted organization identifier. In this context, the device under test may comprise a list of known vendors and their associated capabilities. The device under test therefore can compare the received organization identifier with respect to the list of vendors and advantageously activates the target capability.

According to a further preferred implementation form of said first aspect of the invention, the method further comprises the step of generating a reset command in the transmitting frames, thereby transmitting the reset command to the device under test in order to reset the device under test. Advantageously, the transmission characteristics of the device under test can be reset with ease.

According to a second aspect of the invention, an apparatus for data transmission rate control in a network is provided. The apparatus comprises a communication unit adapted to establish a connection with a device under test. The apparatus further comprises a processing unit adapted to generate rate control commands in vendor specific information element fields of transmitting frames, whereby transmitting the rate control commands to the device under test in order to control the transmission rate of the device under test. Therefore, an extension mechanism built into IEEE 802.11 signaling known as "vendor specific" Information Elements (IE) and corresponding vendor specific action frames are utilized for transporting signaling commands in order to control the transmission behavior of the device under test.

According to a first preferred implementation form of said second aspect of the invention, the communication unit is further adapted to exchange capability information with the device under test during or after the association of the connection. Advantageously, the device under test uses the capability information in order to determine whether it can support the features provided by the network.

According to a second preferred implementation form of said second aspect of the invention, the capability information received from the device under test are rate control capabilities of the device under test. Advantageously, the device under test acknowledges the rate control capability advertisement during or shortly after the association.

According to a further preferred implementation form of said second aspect of the invention, the processing unit is further adapted to generate the rate control commands based on a corresponding rate control capability of the device under test. In order to address one or more capabilities of the device under test, multiple control commands with associated parameters can be advantageously generated on a single transmission frame.

According to a further preferred implementation form of said second aspect of the invention, the communication unit is further adapted to transmit a respective rate control command thereby activating a specific rate control capability of the device under test. Advantageously, the transmission rate of the device under test is controlled in a simplified manner.

According to a further preferred implementation form of said second aspect of the invention, the processing unit is further adapted to update the rate control commands periodically. Advantageously, the transmission rate of the device under test is varied repeatedly in order to measure the transmission characteristics for a target modulation and coding scheme, bandwidth and/or the number of spatial streams.

According to a further preferred implementation form of said second aspect of the invention, the processing unit is further adapted to incorporate an organization identifier with the transmitting frames, thereby transmitting the organization identifier to the device under test. Advantageously, the device under test can effectively identify a specific vendor or manufacturer with ease.

According to a further preferred implementation form of said second aspect of the invention, the communication unit is further adapted to receive capability information from the device under test based on the transmitted organization identifier. Advantageously, the device under test activates a target capability, for instance by comparing the organization identifier with respect to a list of vendors and their associated capabilities.

According to a further preferred implementation form of said second aspect of the invention, the processing unit is further adapted to generate a reset command in the transmitting frames, thereby transmitting the reset command to the device under test in order to reset the device under test. Advantageously, the transmission characteristics of the device under test can be reset with ease.

According to a third aspect of the invention, a system for data transmission rate control in a network comprising an apparatus according to the second aspect of the invention and a device under test is provided. Furthermore, the network is a wireless local area network and wherein the system operates as a part of a Basic Service Set. Advantageously, this allows for a complete assessment of the device under test within the system.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Exemplary embodiments of the invention are now further explained with respect to the drawings by way of example only, and not for limitation. In the drawings:

FIG. 3a shows a transmission frame format of vendor specific information element;

FIG. 3b shows a transmission frame format of vendor specific action frame;

DETAILED DESCRIPTION

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in computer memory storage.

Reference will now be made in detail to the embodiments of the present invention, examples of which are illustrated in the accompanying drawings. Similar entities and reference numbers in different figures have been partially omitted. However, the following embodiments of the present invention may be variously modified and the range of the present invention is not limited by the following embodiments.

Figure 1:
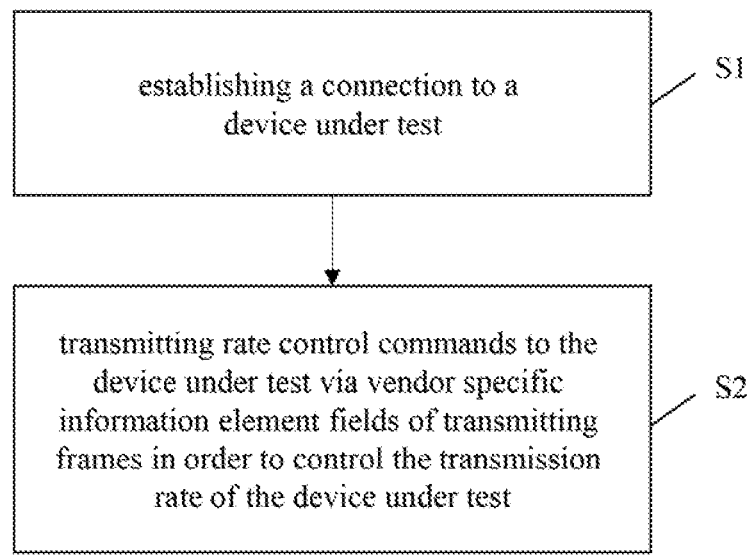
FIG. 1 shows an exemplary embodiment of the method according to the first aspect of the invention.

In FIG. 1, an exemplary embodiment of the method according to the first aspect of the invention is illustrated. In a first step S1, a connection to a device under test is established. In a second step S2, rate control commands are transmitted to the device under test via vendor specific information element fields of transmitting frames in order to control the transmission rate of the device under test.

In addition to this, the method further comprises the step of exchanging capability information with the device under test during or after the association of the connection. In this context, the capability information received from the device under test are rate control capabilities of the device under test.

Moreover, the method further comprises the step of generating the rate control commands based on a corresponding rate control capability of the device under test.

In addition, the method further comprises the step of activating a specific rate control capability of the device under test by transmitting a respective rate control command.

It might be further advantageous if the method further comprises the step of updating the rate control commands periodically.

In addition to this, the method further comprises the step of incorporating an organization identifier with the transmitting frames, thereby transmitting the organization identifier to the device under test.

Further advantageously, the method further comprises the step of receiving capability information from the device under test based on the transmitted organization identifier.

In addition to this, the method further comprises the step of generating a reset command in the transmitting frames, thereby transmitting the reset command to the device under test in order to reset the device under test.

Figure 2:
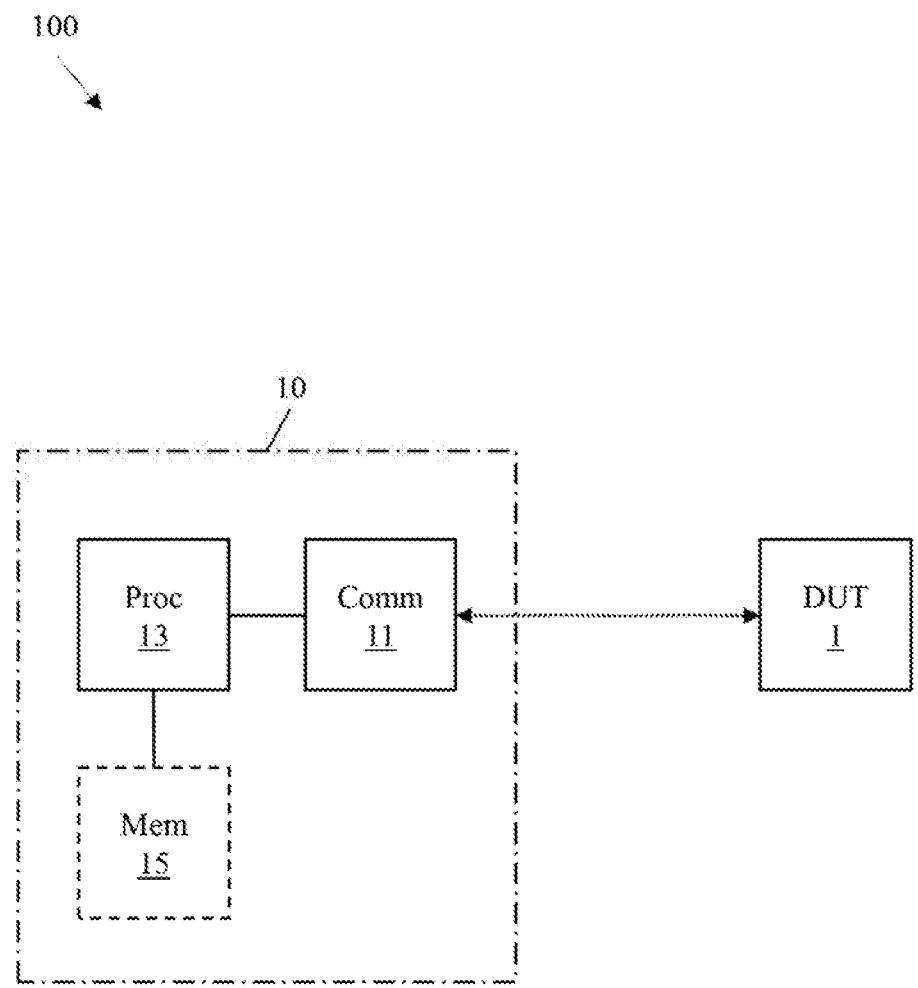
FIG. 2 shows an exemplary embodiment of the apparatus according to the second aspect of the invention and the system according to the third aspect of the invention in a block diagram.

In FIG. 2, an exemplary embodiment of the apparatus 10 according to the second aspect of the invention and the system 100 according to the third aspect of the invention are illustrated in a block diagram. The apparatus 10 comprises a communication unit 11 adapted to establish a connection, preferably a wireless communication connection with a device under test (DUT) 1 according to the IEEE 802.11 communication standards. The communication unit 11 may comprise signal transmission and reception means, for instance signal conversion means, modulation/demodulation means and the like. The communication unit 11 may further comprise an antenna in order to communicate with the DUT 1. The general construction and principle of the aforementioned means are well known in the art and therefore are not described here in greater detail.

The apparatus 10 further comprises a processing unit 13 connected to the communication unit 11, preferably via RF cables. The processing unit 13 is adapted to perform signal generation, frame generation and analysis, control commands generation and the like. In this context, the processing unit 13 may be referred to as microcontrollers, microprocessors, microcomputers, etc. The processing unit 13 may further be configured in hardware, firmware, software, or their combination.

The apparatus 10 may optionally comprise a memory unit 15, connected to the processing unit 13, in order to store the control commands and control parameters. The memory unit 15 may further store programs required for signal processing and controlling of the processing unit 13 and temporarily store input and output information. The memory unit 15 may be implemented into a flash memory-type storage medium, a hard disc-type storage medium, a multimedia card micro-type storage medium, a card-type memory, a Random Access Memory (RAM), a Read-Only Memory (ROM), an Electrically Erasable Programmable Read-Only Memory (EEPROM), a Programmable Read-Only Memory (PROM), a magnetic memory, a magnetic disc, or an optical disk.

The apparatus 10 together with the DUT 1 form an embodiment of the system 100 according to the third aspect of the invention. The network can be exemplified as a wireless local area network (WLAN) according to the IEEE 802.11 standards and the system 100 operates as a part of a Basic Service Set. In this context, the apparatus 10 can be exemplified as a WLAN master or Access Point (AP) and the DUT 1 can be exemplified as a WLAN slave or Station (STA). Alternatively, the apparatus 10 may act as a WLAN slave and the DUT 1 may act as a WLAN master. The apparatus 10 may further be referred to as a test device, test set and the like. The DUT 1 may further be referred to as a mobile station, mobile device and the like.

In FIG. 3a, a transmission frame format of vendor specific information element is illustrated. With the purpose of broadening the protocol aspect and allowing some flexibility to the vendors, IEEE 802.11 standards have a provision to carry non-standard, vendor-specific information in the vendor specific IE field of management frames. This IE (ELEMENT ID 221) is provisioned to always be present as a last IE in the frame body. The vendor specific IE generally carries information within a single defined format, which is not defined by the standards so that the reserved information elements are not usurped due to the presence of non-standard information.

The vendor specific IE requires that the first 3 octets of the information field contain the organization identifier or OUI of the entity that has defined the content of the particular vendor specific IE. The length of the information field n lies between the range of $3 \leq n \leq 255$. In other words, OUI is 3 octets in length and the length of the vendor specific content is n−3 octets.

It is to be noted that multiple vendor specific information elements may appear in a single frame. Furthermore, each vendor specific IE can advantageously have a different OUI value.

In FIG. 3b, a transmission frame format of vendor specific action frame is illustrated. Generally, the vendor specific action frame is defined for vendor-specific signaling. In order to differentiate the vendors, an OUI in the octet field is present immediately after the category field. The category field denotes the type of action field, here 127 for vendor-specific according to the protocol. The OUI has a length of 3 octets, however the length of the vendor specific content is limited by the maximum allowed management protocol data unit size.

Figure 4:
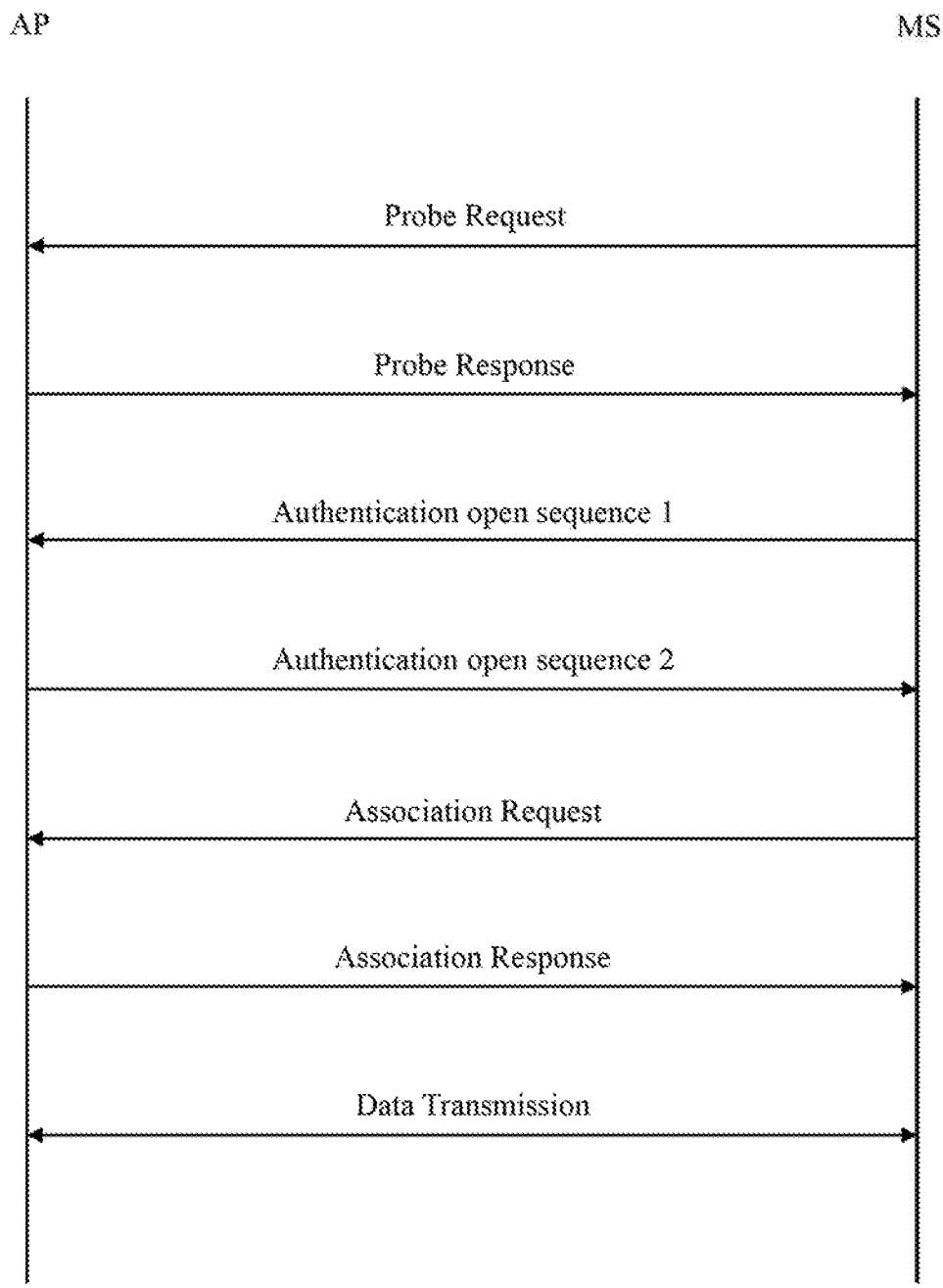
FIG. 4 shows frame transmission and reception between an AP and a MS according to 802.11 standard by way of example only.

In FIG. 4, frame transmission and reception between an Access Point (AP) and a Mobile Station (MS) according to 802.11 standards is illustrated by way of example only. An AP acts as a bridge that conveys traffic between MSs and other devices on the network. However, before a MS can transmit traffic through an AP, it must be in the appropriate connection state. The connection may be initiated either from the AP or from the MS. In order to achieve the appropriate connection state, a MS and an AP exchange a series of IEEE 802.11 management frames.

Generally, the AP transmits beacon frames that contain all the information about the network, in order to announce the presence of a WLAN and to synchronize the MSs of the service set. The AP transmits the beacon frames at regular intervals to allow MSs to find and identify a network, as well as to match parameters for joining the network. A MS sends probe requests to discover WLAN networks within its proximity. Ideally, a probe request advertises the MS supported data rates and capabilities. APs receiving the probe request perform detailed examination in order to see if the MS has at least one common supported data rate. If they have compatible data rates, a probe response is sent advertising the capabilities of the AP, for instance the Service Set Identifier (SSID), supported data rates, encryption types and so on.

Upon identifying compatible APs, the MS sends an authentication frame to an AP setting the authentication to open and the AP responds to the MS with an authentication frame set to open. Once the MS determines which AP it would like to associate to, it will send an association request to that AP. The association request contains chosen encryption types and other compatible capabilities. If the elements in the association request match the capabilities of the AP, the AP will create an Association ID for the MS and respond with an association response with a success message granting network access to the MS.

Figure 5:
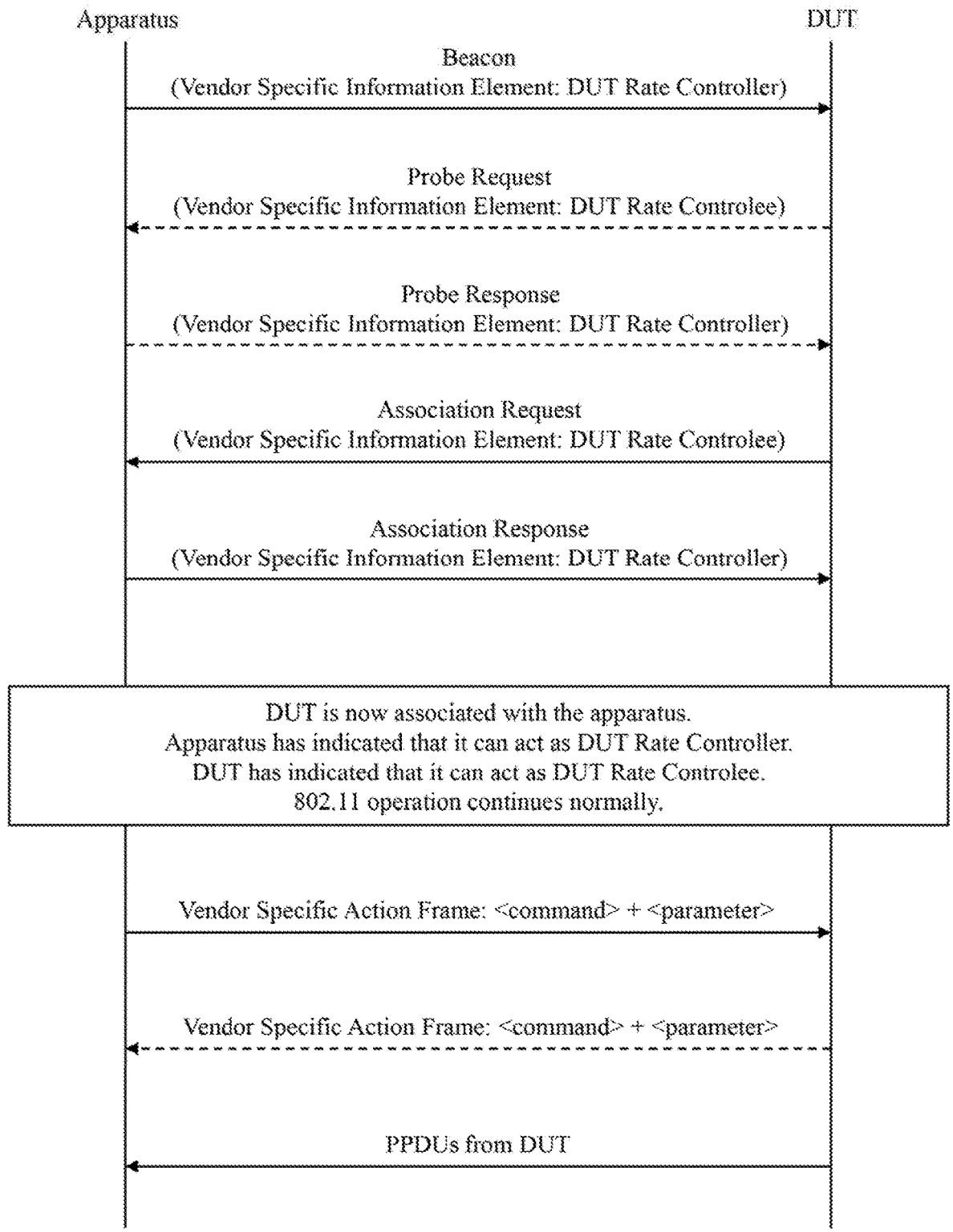
FIG. 5 shows an exemplary embodiment of frame transmission and reception for implementing vendor specific information elements.

In FIG. 5, an exemplary embodiment of frame transmission and reception for implementing vendor specific information elements is illustrated. The apparatus 10 transmits beacon frames comprising vendor specific IE as a last IE in the frame body of beacon, indicating the role of the apparatus 10 as a DUT rate controller. By using the vendor specific IE, up to 253 octets of information can be embedded in each beacon frame. The DUT 1 may optionally send probe request to the apparatus 10 governing the vendor specific IE indicating the DUT 1 to be acted as a DUT controlee. The apparatus 10 may respond to the probe request by transmitting a probe response to the DUT 1. The tracking and searching process, which is largely required in a conventional WLAN network, can be reduced to a nominal effort due to the presence of the OUI in vendor specific IEs of communicated management frames.

As a result, the apparatus 10 receives association request from the DUT 1 and transmits an association response to the DUT 1 in order to establish the appropriate connection state. At this point, the DUT 1 is associated with the apparatus 10. The apparatus 10 has indicated that it may act as DUT rate controller and the DUT 1 also has indicated that it may act as DUT rate controlee. Hence, the normal data transmission operation can be taken place henceforth between the apparatus 10 and the DUT 1.

In terms of transmitted action frames, the apparatus 10 generates rate control commands and respective parameters in the vendor specific content. Preferably, one or more commands and their corresponding parameters are simultaneously generated in a transmission frame. In response, the apparatus 10 receives one or more PPDU types from the DUT 1 as per the transmitted rate control commands.

The method according to the first aspect corresponds to the apparatus according to the second aspect and the system according to the third aspect. Therefore, the disclosure with regard to any of the aspects is also relevant with regard to the other aspects of the invention.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A method for data transmission rate control in a network comprising the steps of:
   establishing a connection to a device under test, and
   transmitting rate control commands to the device under test via vendor specific information element fields of transmitting frames in order to control the transmission rate of the device under test,
   wherein the vendor specific information element fields of the transmitting frames correspond to vendor specific information elements of IEEE 802.11 signaling and corresponding vendor specific action frames are utilized for transporting signaling commands in order to control transmission behavior of the device under test, and wherein the method further comprises the step of incorporating an organization identifier with the transmitting frames, thereby transmitting the organization identifier to the device under test.

2. The method according to claim 1, wherein the method further comprises the step of exchanging capability information with the device under test during or after the association of the connection.

3. The method according to claim 2, wherein the capability information received from the device under test are rate control capabilities of the device under test.

4. The method according to claim 1, wherein the method further comprises the step of generating the rate control commands based on a corresponding rate control capability of the device under test.

5. The method according to claim 4, wherein the method further comprises the step of activating a specific rate control capability of the device under test by transmitting a respective rate control command.

6. The method according to claim 1, wherein the method further comprises the step of updating the rate control commands periodically.

7. The method according to claim 1, wherein the method further comprises the step of receiving capability information from the device under test based on the transmitted organization identifier.

8. The method according to claim 1, wherein the method further comprises the step of generating a reset command in the transmitting frames, thereby transmitting the reset command to the device under test in order to reset the device under test.

9. An apparatus for data transmission rate control in a network comprising:
a communication unit adapted to establish a connection with a device under test, and
a processing unit adapted to generate rate control commands in vendor specific information element fields of transmitting frames,
wherein the communication unit is adapted to transmit the rate control commands in the vendor specific information element fields of the transmitting frames to the device under test in order to control the transmission rate of the device under test,
wherein the vendor specific information element fields of the transmitting frames correspond to vendor specific information elements of IEEE 802.11 signaling and corresponding vendor specific action frames are utilized for transporting signaling commands in order to control transmission behavior of the device under test, and
wherein the processing unit is further adapted to incorporate an organization identifier with the transmitting frames, thereby transmitting the organization identifier to the device under test.

10. The apparatus according to claim 9, wherein the communication unit is further adapted to exchange capability information with the device under test during or after the association of the connection.

11. The apparatus according to claim 10, wherein the capability information received from the device under test are rate control capabilities of the device under test.

12. The apparatus according to claim 9, wherein the processing unit is further adapted to generate the rate control commands based on a corresponding rate control capability of the device under test.

13. The apparatus according to claim 12, wherein the communication unit is further adapted to transmit a respective rate control command thereby activating a specific rate control capability of the device under test.

14. The apparatus according to claim 9, wherein the processing unit is further adapted to update the rate control commands periodically.

15. The apparatus according to claim 9, wherein the communication unit is further adapted to receive capability information from the device under test based on the transmitted organization identifier.

16. The apparatus according to claim 9, wherein the processing unit is further adapted to generate a reset command in the transmitting frames, thereby transmitting the reset command to the device under test in order to reset the device under test.

17. A system comprising an apparatus of claim 9 and a device under test for data transmission rate control in a network.

18. The system according to claim 17, wherein the network is a wireless local area network and wherein the system operates as a part of a Basic Service Set.

* * * * *